(12) United States Patent
Tsuchiaki

(10) Patent No.: US 9,093,504 B2
(45) Date of Patent: Jul. 28, 2015

(54) SEMICONDUCTOR DEVICE MANUFACTURING METHOD AND SEMICONDUCTOR DEVICE

(71) Applicant: Kabushiki Kaisha Toshiba, Tokyo (JP)

(72) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 13/788,894

(22) Filed: Mar. 7, 2013

(65) Prior Publication Data
US 2013/0320543 A1   Dec. 5, 2013

(30) Foreign Application Priority Data

May 31, 2012 (JP) ................................. 2012-124120

(51) Int. Cl.
H01L 21/768 (2006.01)
H01L 23/532 (2006.01)
H01L 27/24 (2006.01)
H01L 45/00 (2006.01)

(52) U.S. Cl.
CPC .... *H01L 21/76889* (2013.01); *H01L 21/76885* (2013.01); *H01L 23/53204* (2013.01); *H01L 27/2463* (2013.01); *H01L 27/2481* (2013.01); *H01L 45/085* (2013.01); *H01L 45/1233* (2013.01); *H01L 45/1266* (2013.01); *H01L 45/145* (2013.01); *H01L 45/148* (2013.01); *H01L 45/1675* (2013.01); *H01L 2924/0002* (2013.01)

(58) Field of Classification Search
CPC ................................................ H01L 27/11578
USPC ........................................................ 438/129
See application file for complete search history.

(56) References Cited

U.S. PATENT DOCUMENTS

| 6,372,572 | B1* | 4/2002 | Yu et al. .......................... 438/241 |
| 2005/0272265 | A1* | 12/2005 | Geffken et al. ................ 438/706 |
| 2006/0092685 | A1 | 5/2006 | Ootsuka et al. |
| 2007/0134898 | A1* | 6/2007 | Takeoka et al. ................ 438/592 |
| 2011/0070713 | A1 | 3/2011 | Nansei |
| 2012/0205727 | A1* | 8/2012 | Kanakasabapathy et al. ............................. 257/288 |

FOREIGN PATENT DOCUMENTS

| JP | 2006318982 A | 11/2006 |
| JP | 2007329274 A | 12/2007 |
| JP | 2011-071226 | 4/2011 |

OTHER PUBLICATIONS

S. Jo et al. "CMOS Compatible Nanoscale Nonvolatile Resistance Switching Memory", Nano Letters, vol. 8, No. 2, 2008, pp. 392-397.
J. Brewer et al. "Nonvolatile Memory Technologies with Emphasis on Flash", IEEE Press Series on Microelectronics Systems, IEEE Press, 2008, pp. 8-9.

* cited by examiner

Primary Examiner — Peniel M Gumedzoe
Assistant Examiner — Christopher Johnson
(74) Attorney, Agent, or Firm — Patterson & Sheridan, LLP

(57) ABSTRACT

A semiconductor device is manufactured by forming, on an insulating base material, a first support element having a side face that extends from a surface of the insulating base material, forming a coating of amorphous silicon on the side face of the first support element, filling an aperture disposed between the first support element and a second support element that extends from a surface of the insulating base material with an insulating film, planarizing the insulating film to expose an exposed portion of the coating and a surface of the first support element, and siliciding the amorphous silicon of the coating to form an interconnect.

10 Claims, 14 Drawing Sheets

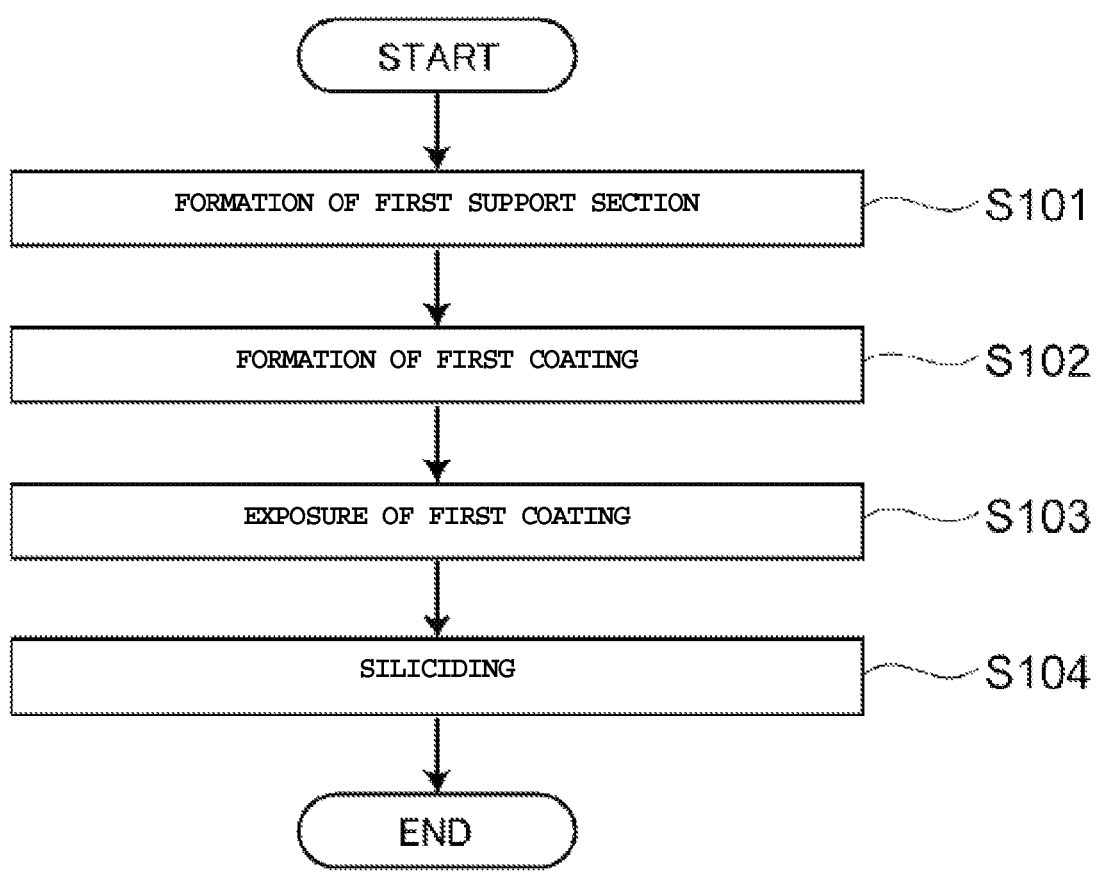

FIG. 2A
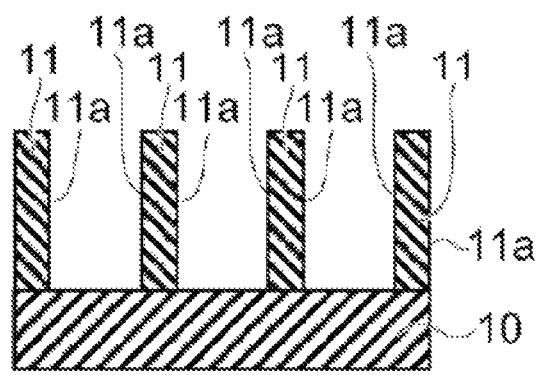
FIG. 2B
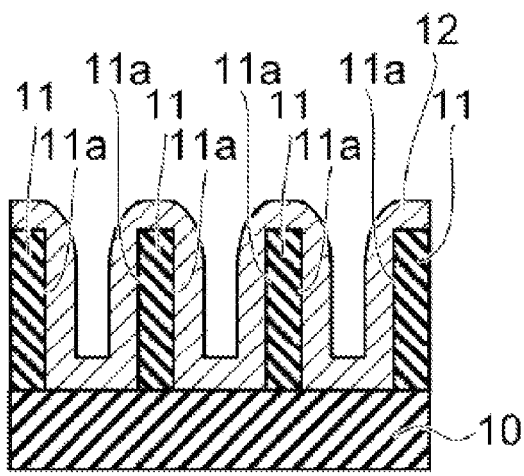
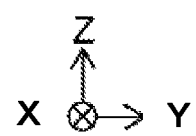

SEMICONDUCTOR DEVICE MANUFACTURING METHOD AND SEMICONDUCTOR DEVICE

CROSS-REFERENCE TO RELATED APPLICATION

This application is based upon and claims the benefit of priority from Japanese Patent Application No. 2012-124120, filed May 31, 2012, the entire contents of which are incorporated herein by reference.

FIELD

Embodiments described herein relate to a semiconductor device manufacturing method and a semiconductor device.

BACKGROUND

In recent years, an aggressive scaling-down of individual device elements in an advanced semiconductor device has required commensurate shrinkage of the physical dimensions of the interconnect patterns. Some interconnect patterns require a line width equal to or less than 10 nanometers. For example, in the case of a NAND-type nonvolatile memory, miniaturized patterns are preferably formed in a uniform manner for the purpose of providing a higher capacity.

DESCRIPTION OF THE DRAWINGS

FIG. 1 is a flowchart illustrating a semiconductor device manufacturing method according to a first embodiment;

FIG. 2A to FIG. 2G are schematic cross-sectional views illustrating the semiconductor device manufacturing method according to the first embodiment;

DETAILED DESCRIPTION

Figure 2C:
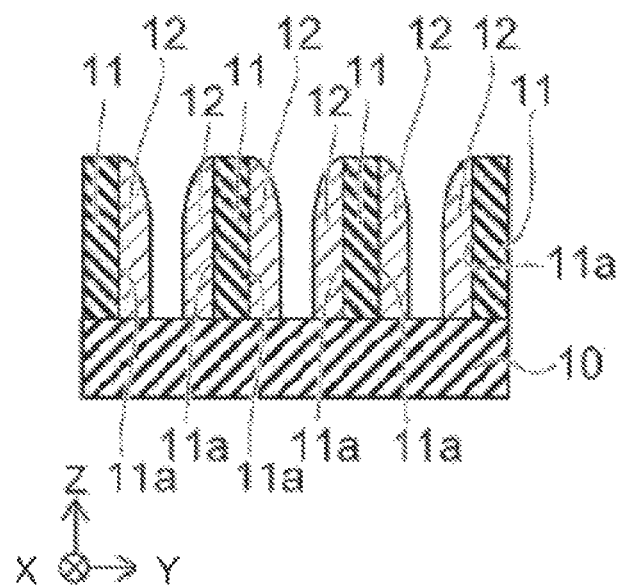

Embodiments provide a semiconductor device manufacturing method and a semiconductor device according to which a interconnect pattern is formed in a uniform and stable manner.

In general, according to one embodiment, a semiconductor device manufacturing method comprises forming, on an insulating base material, a first support element having a side face that extends from a surface of the insulating base material, forming a coating of amorphous silicon on the side face of the first support element, filling an aperture disposed between the first support element and a second support element that extends from a surface of the insulating base material with an insulating film, planarizing the insulating film to expose an upper portion of the coating and a surface of the first support element, and siliciding the amorphous silicon of the coating to form an interconnect.

Embodiments will be explained with reference to the figures. The drawings in the figures are schematic or conceptual in nature. Thus, the relationship between the thickness and the width of each part and the ratio coefficient of the size are not always the same as the actual ones. Even the same parts in the drawings may be shown by different sizes or proportions. In the specification of this application and the respective drawings, the elements that are the same as those already described with reference to the drawings are denoted with the same reference numerals and will not be described further.

(Embodiment 1)

FIG. 1 is a flowchart illustrating a semiconductor device manufacturing method according to Embodiment 1.

The semiconductor device manufacturing method according to this embodiment includes: the first support element formation (Step S101), the first coating formation (Step S102), the first coating exposure (Step S103), and siliciding (Step S104).

The first support element formation (Step S101) includes forming, on the insulating substrate, a first support element having a side face extending from a surface of the insulating base material.

The first coating formation (Step S102) includes forming a first coating of amorphous silicon on the side face of the first support element.

The first coating exposure (Step S103) includes coating the first coating with the first insulating film to planarize the surface of the first insulating film to expose the first coating from the surface.

Siliciding (Step S104) includes siliciding the amorphous silicon of the first coating.

FIGS. 2A to 2G are schematic cross-sectional views illustrating the semiconductor device manufacturing method according to Embodiment 1.

A direction along which the respective layers are stacked is assumed to be the Z-axis direction. One of the directions orthogonal to the Z-axis direction is assumed to be the X-axis direction. A direction orthogonal to the Z-axis direction and the X-axis direction is assumed to be the Y-axis direction. The cross sections shown in FIGS. 2A to 2G are on a Z-X plane.

First, as shown in FIG. 2A, an insulating base material 10 has thereon the first support element 11. The insulating base material 10 is a silicon nitride film, for example. The first support element 11 is an insulating material including a boron-containing silicon dioxide, for example. By depositing an insulating layer including a boron-containing silicon dioxide with Chemical Vapor Deposition (CVD) for example, and subsequently patterning it by means of techniques such as photolithography and Reactive Ion Etching (RIE), the first support element 11 is formed.

Multiple first support elements 11 are arranged on the insulating base material 10 in parallel with one another, for example. The multiple first support elements 11 are formed to extend in one direction (the Y-axis direction), for example. Each of the first support elements 11 has a side face 11a that extends from the surface of the insulating base material 10.

As an example, the first support element 11 has a width of 10 nanometers (nm) and a height of 100 nm. The multiple first support elements 11 are arranged with a pitch of 40 nm.

Next, as shown in FIG. 2B, the first coating 12 of amorphous silicon is formed by CVD, for example, on the side face 11a of the first support element 11 and has a substantially uniform thickness.

The first coating 12 is conformally deposited over the entirety of the structure including the side face 11a of the first support element 11 (the structure in which the insulating base material 10 has thereon the first support element 11). The first coating 12 has a thickness of 10 nm, for example. Specifically, the first coating 12 is formed conformally on both of the side faces 11a of the first support element 11 with a thickness of 10 nm, for example. The first coating 12 is generally formed to have a thickness of 10 nm or less.

The first coating 12 is composed of amorphous silicon and is formed, for example, with a pressure of 0.2 Torr, a temperature of 400° C., and a reaction gas of $SiH_4$.

Next, as shown in FIG. 2C, a part of the first coating 12 that is formed on the upper face of the first support element 11 and the surface of the insulating base material 10 is removed. For example, the RIE method is used to remove the first coating 12 of amorphous silicon. As a result, the first coating 12 of amorphous silicon remains only on the side face 11a of the first support element 11.

Figure 2D:
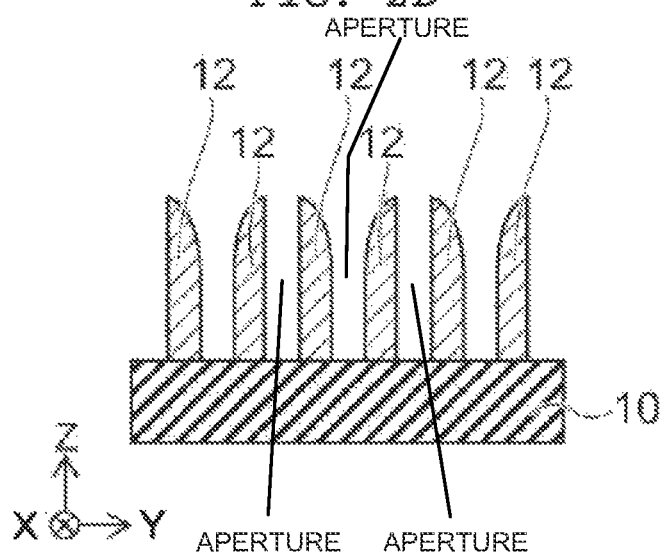

Next, as shown in FIG. 2D, the first support element 11 having thereon the first coating 12 is removed to leave the first coating 12 of amorphous silicon only.

For example, hydrofluoric acid vapor is used to remove the first support element 11 of a silicon dioxide film while allowing the first coating 12 of amorphous silicon to remain. As a result, multiple patterns by the first coating 12 are formed.

Figure 2E:
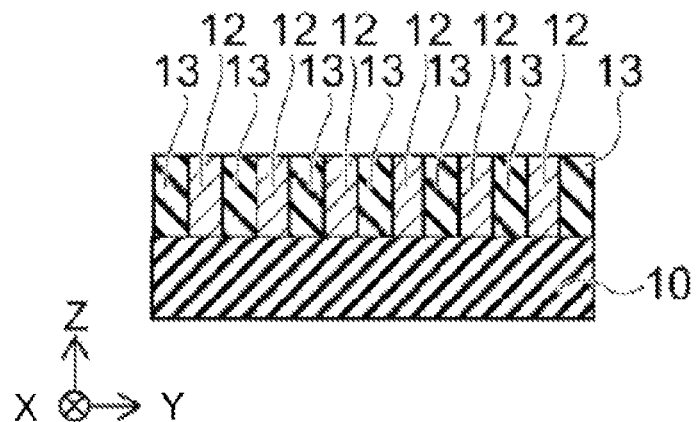

Next, as shown in FIG. 2E, the first insulating films 13 are formed to fill up the spaces between multiple patterns of the first coating 12. The first insulating film 13 is composed, for example, of silicon oxide. The first insulating film 13 can be formed by applying a fluid material, such as SOG (Spin on Glass: silicone compound RnSi (OH) 4-n and dopant material) and subsequent hardening. The first insulating film 13 is deposited by spin coating, for example. The interval among the plurality of patterns formed by the first coating 12 is secured by forming the first insulating film 13 in the apertures of the patterns of the first coating 12.

The surface of the first insulating film 13 is then planarized, for example by a Chemical Mechanical Polishing (CMP) process. This planarization consequently exposes surfaces of the first coating 12 and of the first insulating film 13.

Figure 2F:
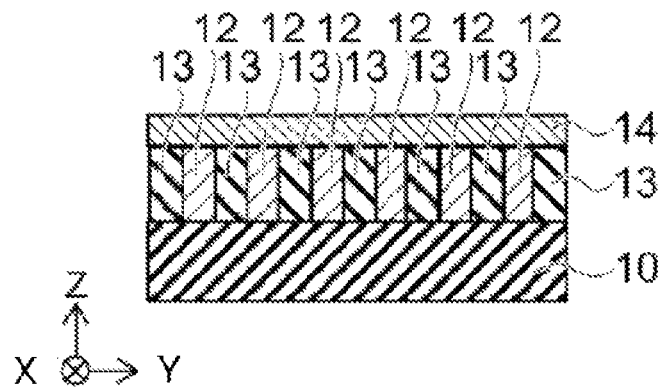

Next, as shown in FIG. 2F, the first metal film 14 is formed on the surface of the planarized first insulating film 13. The first metal film 14 is formed by sputtering for example. The first metal film 14 is composed of one material selected from among nickel (Ni), cobalt (Co), and titanium (Ti), for example. The first metal film 14 is formed to have a thickness of about 50 nm, for example. The first metal film 14 is formed indirect contact with the exposed surfaces of the first coating 12 exposed from the first insulating film 13 by the previous planarization process. The first metal film 14 may have thereon a cap layer by titanium (Ti) or titanium nitride (TiN), for example.

Next, the first coating 12 of amorphous silicon is silicided. For example, the first coating 12 is subjected to a rapid heat treatment in nitrogen atmosphere at 450° C. for 30 seconds. This consequently promotes the siliciding reaction between the first metal film 14 of Ni and the first coating 12 of amorphous silicon abutted to the first metal film 14, for example. The unreacted first metal film (e.g., Ni) 14 is selectively removed by being immersed in the mixed liquid of sulfuric acid and aqueous hydrogen peroxide. If required, the removal of the first metal film 14 may be followed by the planarization of the surface by the CMP method, for example.

Figure 2G:
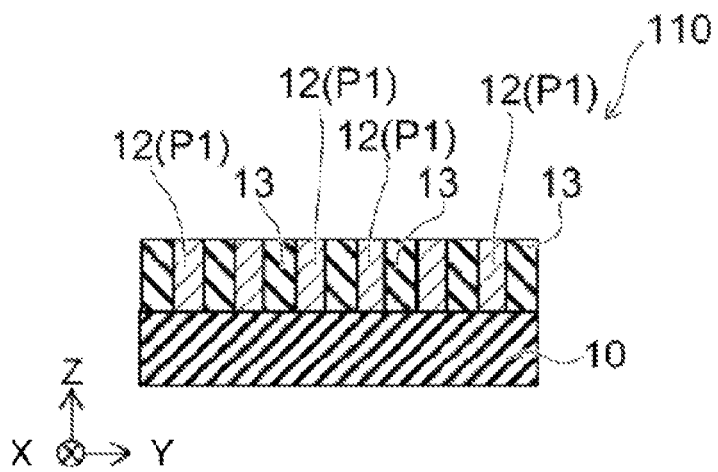

As a result, as shown in FIG. 2G, multiple interconnect patterns (the first interconnect P1) are formed by siliciding multiple patterns of the first coating 12.

An interconnect pattern can be uniformly and stably formed by simple steps as described above.

The semiconductor device 110 according to this embodiment includes the interconnect pattern (the first interconnect P1) formed by these steps. The first interconnect P1 included in a semiconductor device 110 has a line width of from 5 nm to 28 nm, for example. Even when the first interconnect P1 has a line width of 10 nm or less, it can function as a metal interconnect of sufficiently low resistance, as explained below.

The free electrons in a compound of Ni and Si have a mean free path of about 5 nm. This is very short when compared to those of copper (Cu: mean free path of 40 nm) and tungsten (W: mean free path of 28 nm). Thus, in contrast to Cu and W, when the first interconnect P1 has a miniaturized line width of 10 nm or less, precipitous increase of wire resistance due to electron scattering at the interconnect surface/interface can be effectively suppressed. Specifically, in this embodiment, a lower resistance can be provided even when the first interconnect P1 has a line width of 10 nm or less (e.g., down to a line width of about 5 nm, which is substantially equal to the mean free path of a free electron in interconnect P1).

(Embodiment 2)

Next, the following section will describe the semiconductor device manufacturing method according to Embodiment 2.

A semiconductor device 120 manufactured by the manufacturing method according to Embodiment 2 is a cross-point type semiconductor storage device, for example. In this embodiment, a resistance change memory will be described, in which a silver (Ag)—containing conduction path (i.e., filament) is reversibly formed in an insulating interlayer interposed between two electrodes.

FIG. 3A to FIG. 3E are schematic cross-sectional views illustrating the semiconductor device manufacturing method according to Embodiment 2.

The cross sections shown in FIG. 3A to FIG. 3E are on a Z-Y plane. The cross sections shown in FIG. 4A to FIG. 5C are on a Z-Y plane.

In Embodiment 2, the first interconnect P1 is first formed by the manufacturing method according to Embodiment 1 shown in FIG. 2A to FIG. 2G. The layer including the first interconnect P1 will be referred to as the first layer L1. The surface of the first layer L1 is planarized by the CMP method, for example. The first interconnect P1 is exposed at the surface of the first layer L1.

Figure 3A:
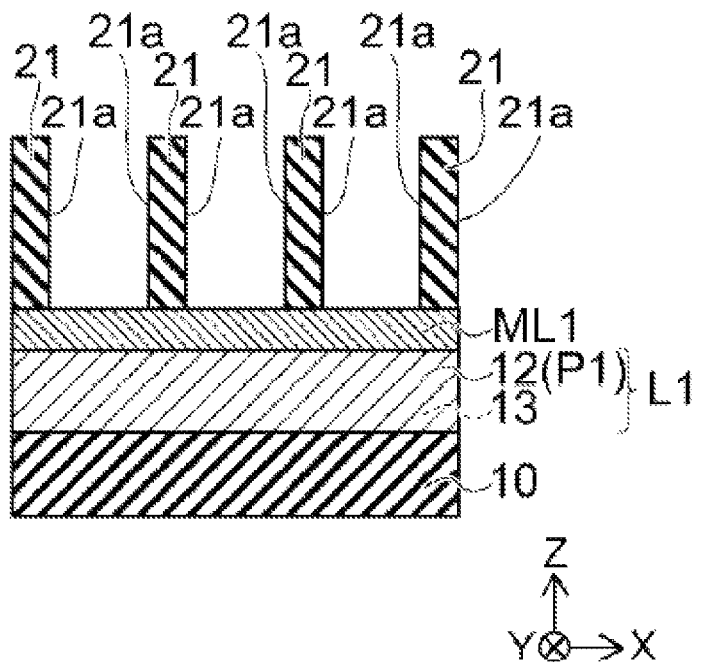
FIG. 3A to FIG. 3E are schematic cross-sectional views illustrating a semiconductor device manufacturing method according to a second embodiment.

Next, as shown in FIG. 3A, the first interlayer film ML1 has thereon the second support element 21. The first interlayer film ML1 is formed on the first layer (the first insulating film 13 and the first interconnect P1) to have a uniform thickness. The first interlayer film ML1 may be composed of any of amorphous silicon, oxide silicon, or nitride silicon, for example. In this embodiment, the first interlayer film ML1 is composed of amorphous silicon. The first interlayer film ML1 may be formed by the CVD method, for example. The second support element 21 is an insulating material including a boron-containing silicon dioxide, for example. By depositing an insulating layer including a boron-containing silicon dioxide with CVD, for example, and subsequently patterning it by means of techniques such as photolithography and RIE, the second support element 21 is formed.

The multiple second support sections 21 are configured in parallel, for example, on the first interlayer film ML1. The multiple second support elements 21 are configured, for example, so as to extend in a direction (e.g., the X-axis direction) different from the direction along which the first interconnect P1 extends (the Y-axis direction). Each of the second support elements 21 has a side face 21a raised from the surface of the first interlayer film ML1. As an example, the second support element 21 has a width of 10 nm and a height of 100 nm, and the pitch of the multiple second support elements 21 (i.e., the center-to-center distance) is 40 nm.

Figure 3B:
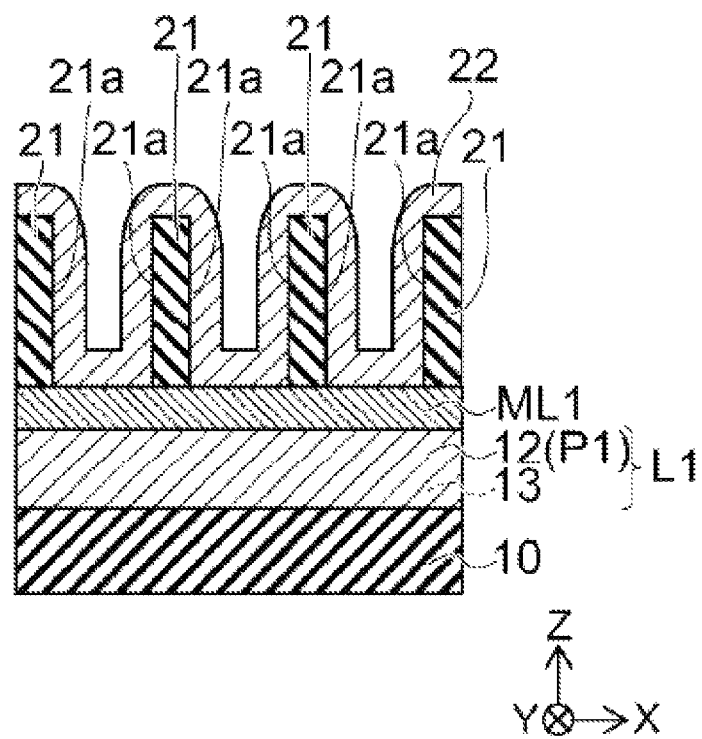

Next, as shown in FIG. 3B, the second coating 22 of silver (Ag) is formed on the side face 21a of the second support element 21 to have a substantially uniform thickness by sputtering, for example.

The second coating 22 is conformally deposited over the entirety of the structure including the side face 21a of the second support element 21 (i.e., the structure that is formed on the first interlayer film ML1). The second coating 22 has a thickness of 12 nm, for example. The second coating 22 is formed on both of the side faces 21a of the second support element 21.

Figure 3C:
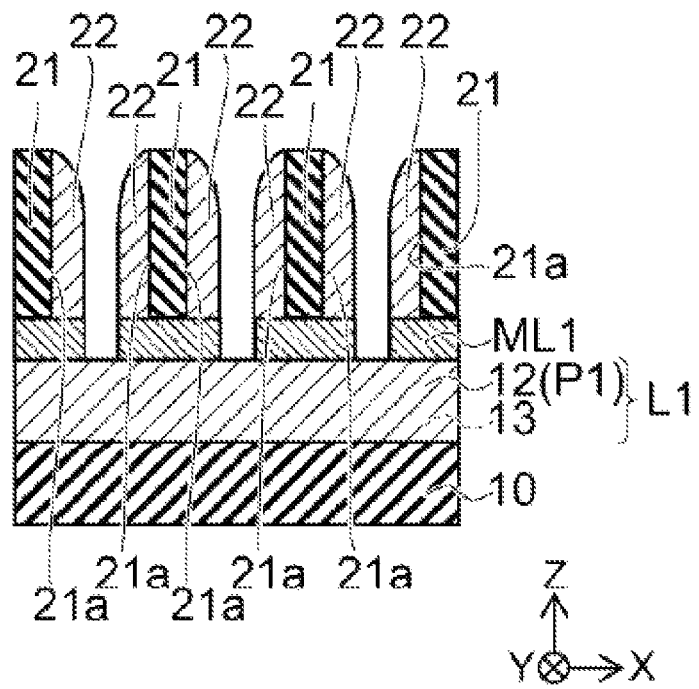

Next, as shown in FIG. 3C, a part of the second coating 22 that is formed on the upper face of the second support element 21 and the surface of the first interlayer film ML1 is removed. For example, the RIE method is used to remove portions of the second coating 22 of Ag. As a result, the second coating 22 of Ag remains only on the side face 21a of the second support element 21. This etching process also removes portions of the first interlayer film ML1 that is exposed between the spacing of the second coatings 22.

Figure 3D:
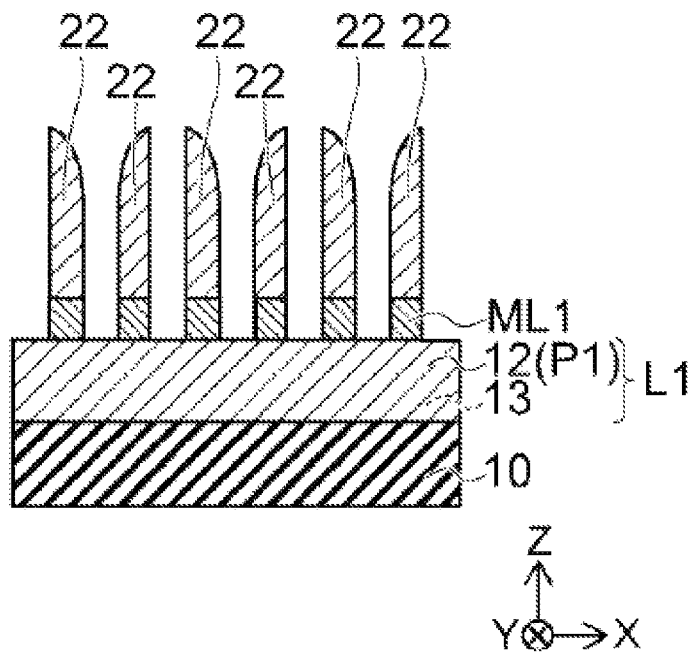

Next, as shown in FIG. 3D, the second support element 21, which has portions of the second coating 22 disposed on side faces 21a, is removed so that only the second coating 22 of Ag remains.

For example, hydrofluoric acid vapor may be used to remove the second support element 21 of a silicon dioxide film while allowing the second coating 22 of Ag to remain. As a result, the multiple patterns (the second interconnect P2) are formed by the second coating 22. A part of the first interlayer film ML1 below the second support element 21 is also removed.

Figure 3E:
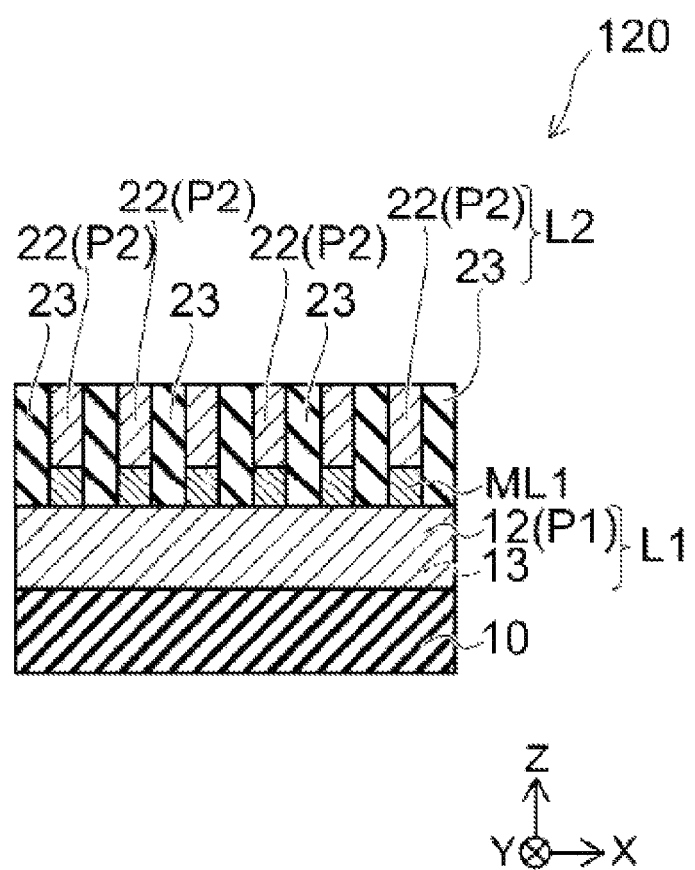

Next, as shown in FIG. 3E, the second insulating film 23 is to fill up the spaces between multiple patterns of the second coating 22. The second insulating film 23 is composed, for example, of silicon oxide. The second insulating film 23 can be formed by applying a fluid material, such as SOG (Spin on Glass: silicone compound RnSi (OH) 4-n and dopant material) and subsequent hardening. The second insulating film 23 is deposited by spin coating, for example. The interval between the multiple patterns by the second coating 22 is secured by depositing the second insulating film 23 inside the apertures of the patterns of the second coating 22.

The surface of the second insulating film 23 is then planarized by the CMP method, for example. The layer thus formed above the first interlayer film ML1, including the second interconnect P2 will be referred to as the second layer L2.

Through these steps, the semiconductor device 120 is completed. In the semiconductor device 120, the first interlayer film (amorphous silicon) ML1 provided between the first layer L1 (including the first interconnect, P1) and the second layer L2 (including the second interconnect, P2) functions as an insulating interlayer interposed between two electrodes (i.e., P1 and P2) of a resistance change memory. The second coating (the second interconnect P2) of Ag not only serves as the second interconnect (i.e., as a part of electrodes of cross-point type memory cell) but also provides a source material of conduction path (filament) formation (i.e., positively-charged Ag ions) into the first interlayer film (amorphous silicon) ML1, so that Ag-containing filament can be reversibly formed to repeatably change a resistance between P1 and P2.

(Embodiment 3)

Next, the following section will describe the semiconductor device manufacturing method according to Embodiment 3.

A semiconductor device 130 manufactured by the manufacturing method according to Embodiment 3 is a cross-point type semiconductor storage device in which memory cells are stacked. Embodiment 3 provides, as in Embodiment 2, a resistance change memory in which a Ag-containing conduction path (filament) is reversibly formed in an insulating interlayer. FIG. 4A to FIG. 5C are schematic cross-sectional views illustrating the semiconductor device manufacturing method according to Embodiment 3. The cross sections shown in FIG. 4A to FIG. 5C are on a Z-X plane.

In Embodiment 3, the manufacturing method according to Embodiment 1 shown in FIG. 2A to FIG. 2G is used to form the first layer L1. The manufacturing method according to Embodiment 2 shown in FIG. 3A to FIG. 3E is used to form the second layer L2. The planarized second interconnect P2 is exposed at the surface of the second layer L2.

Figure 4A:
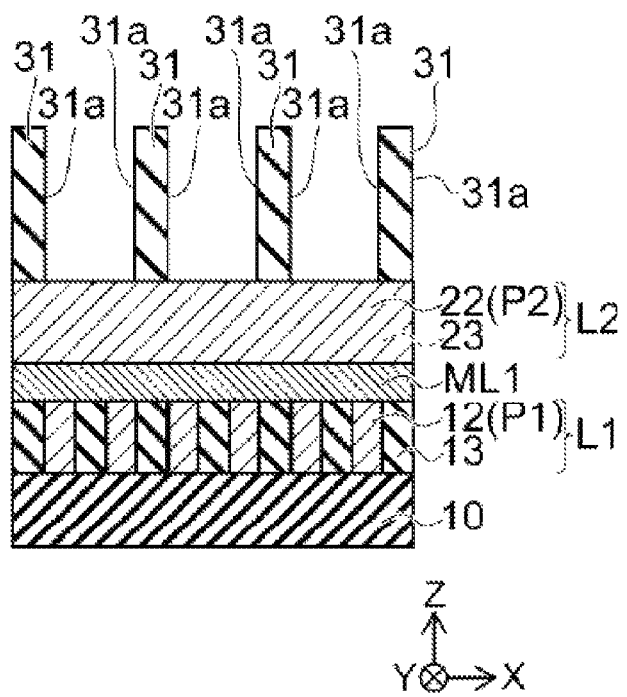
FIG. 4A to FIG. 4D are schematic cross-sectional views illustrating the semiconductor device manufacturing method according to a third embodiment.

Next, as shown in FIG. 4A, the third support element 31 is formed on the second layer L2. The third support element 31 is an insulating material including a boron-containing silicon dioxide, for example. By depositing an insulating layer including a boron-containing silicon dioxide with CVD, for example, and subsequently patterning it by means of techniques such as photolithography and RIE, third support element 31 is formed.

The multiple third support elements 31 are arranged in parallel, for example, on the second layer L2. The multiple third support elements 31 are respectively provided, for example, so as to extend in a direction (the Y-axis direction) different from the direction along which the second interconnect P2 extends (i.e., the X-axis direction). Each of the third support elements 31 has a side face 31a raised from the surface of the second layer L2.

As an example, each of the third support elements 31 has a width of 10 nm and a height of 100 nm. The multiple third support elements 31 are arranged with a pitch of 40 nm.

Figure 4B:
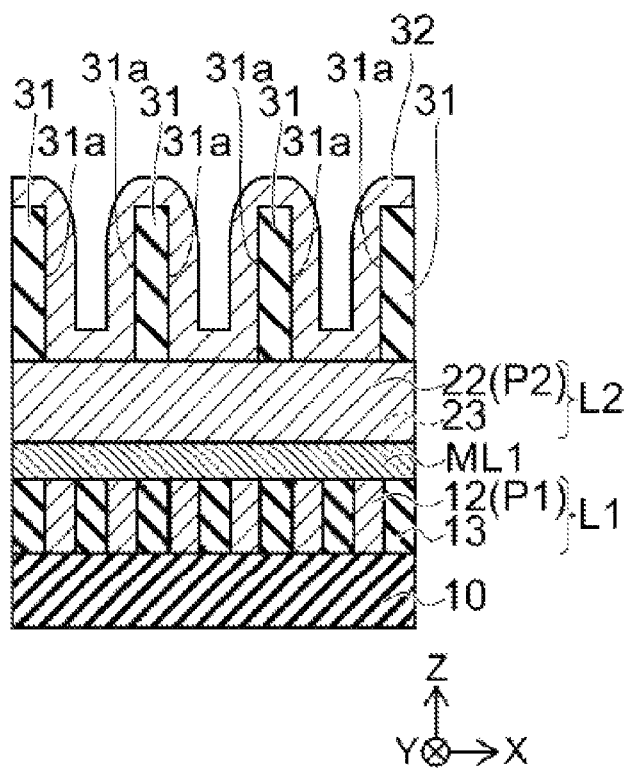

Next, as shown in FIG. 4B, the side face 31a of the third support element 31 has conformally deposited thereon the third coating 32 of amorphous silicon. The third coating 32 may be formed by the CVD method, for example, and has a substantially uniform thickness.

The third coating 32 is formed over the entirety of the structure, including the side face 31a of the third support element 31 (i.e., the structure that is formed on the second layer L2). The third coating 32 has a thickness of 8 nm, for example. The third coating 32 is formed conformally on both of the side faces 31a of the third support element 31 with a thickness of 8 nm, for example. The third coating 32 is formed to have a thickness of 8 nm or less depending on the formation conditions.

The third coating 32 of amorphous silicon is formed, for example, with a pressure of 0.2 Torr, a temperature of 400° C., and a reaction gas of $SiH_4$.

Figure 4C:
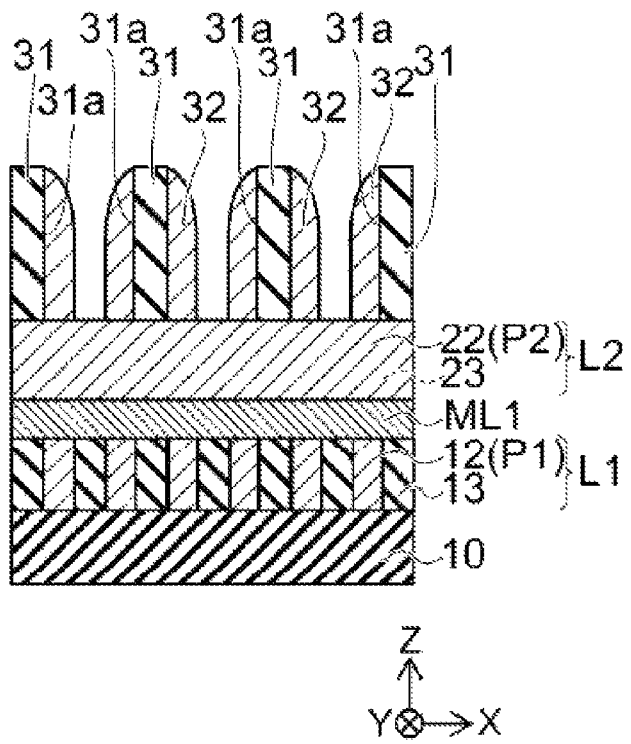

Next, as shown in FIG. 4C, a part of the third coating 32 that is formed on the upper face of the third support element 31 and the surface of the second layer L2 is removed. For example, the RIE method may be used to remove the third coating 32 of amorphous silicon. As a result, the third coating 32 of amorphous silicon remains only on the side face 31a of the third support element 31.

Figure 4D:
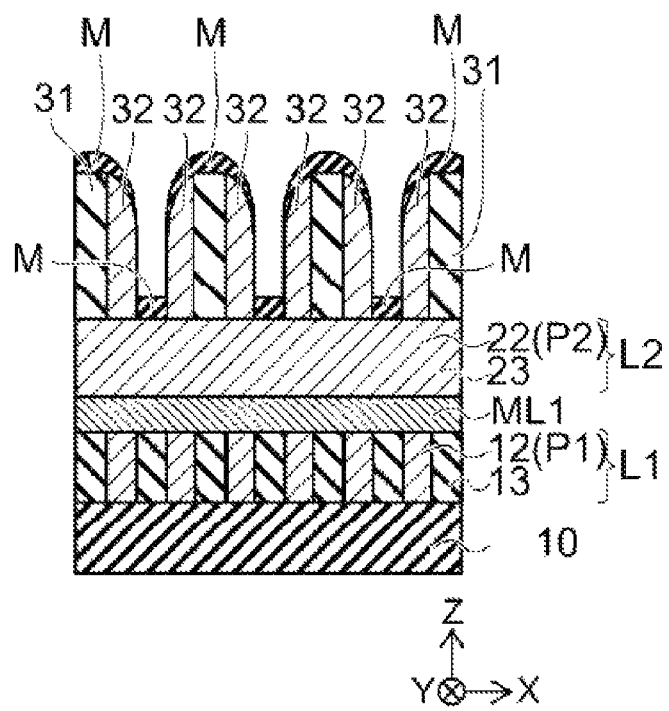

Next, as shown in FIG. 4D, a mask M is formed on portions of the exposed surface of the third coating 32. As shown in FIG. 4D, portions of the surface of third coating 32 on which mask M is not formed include nearly vertical surfaces of the third coating 32 that are disposed in the aperture disposed between the third support elements 31 and facing another surface of the third coating 32. The mask M is a silicon nitride film, for example. The mask M of a silicon nitride film is selectively deposited and formed by a gas cluster ion beam, for example, only on the top section of the third coating 32 (i.e., surfaces of the third coating 32 facing in the Z-axis direction) and the exposed surface of the second layer L2.

The mask M is formed by a gas cluster ion beam by, for example, ejecting high-pressure gas including one selected from among $SiH_4$, $Si_2H_6$, and $Si_3H_8$ and one selected from among $NH_3$, $NF_3$, and $N_2$ through a nozzle to the third coating 32.

When silane gas ($SiH_4$) and ammonia gas ($NH_3$) are used, these gases are mixed at about a 1 to 2 volume ratio, for example. The pressurized gas mixture at about 10 atmospheres, for example, is injected through a tiny nozzle having a diameter of 3 millimeters (mm), for example, into a low ambient pressure environment. Adiabatic expansion rapidly cools down the material gas and large atomic clusters are formed that includes about 5,000 to 15,000 Si, N, and H atoms. When subsequently irradiated with an electron beam, electric charges are imparted to these clusters. The charged clusters are then accelerated by a voltage of 30 kilovolts (kV) to 60 kV, for example, to produce a directional flow. By directing these clusters to vertically bombard the structure shown in FIG. 4C, the mask M including a silicon nitride film is selectively deposited in a highly directional fashion. The mask M forms only on the top section of the third coating 32 and also the exposed surface of the second layer L2, while leaving the center part of the side face of the third coating 32 unmasked. During this process, hydrogen, which could be included in the silicon nitride film, may be removed by applying a heat treatment between about 200° C. and about 300° C. Otherwise, the mask M may be formed by performing a high-dose oxygen or nitrogen ion implantation onto the top section of the third coating 32 and the exposed surface of the second layer L2.

Figure 5A:
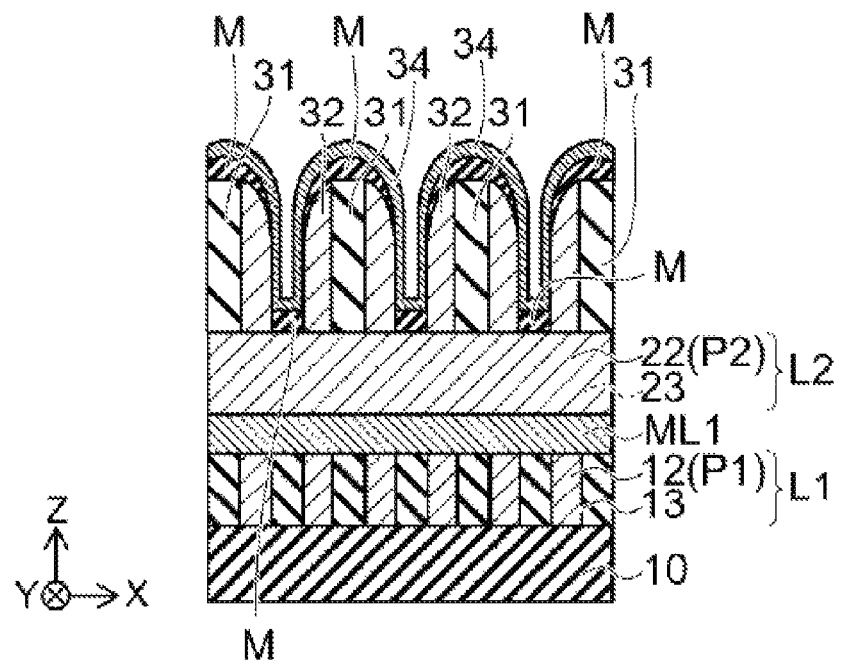
FIG. 5A to FIG. 5C are schematic cross-sectional views illustrating the semiconductor device manufacturing method according to the third embodiment.

Next, as shown in FIG. 5A, the second metal film 34 is formed over the structure of FIG. 4D. The second metal film 34 is formed by the sputtering or CVD method, for example. The second metal film 34 uses the Ni, Co, or Ti, for example. The second metal film 34 is formed to have a thickness of about 4 nm, for example. The second metal film 34 is formed in direct contact with the center part of the side face of the third coating 32 that is not masked by M.

Figure 5B:
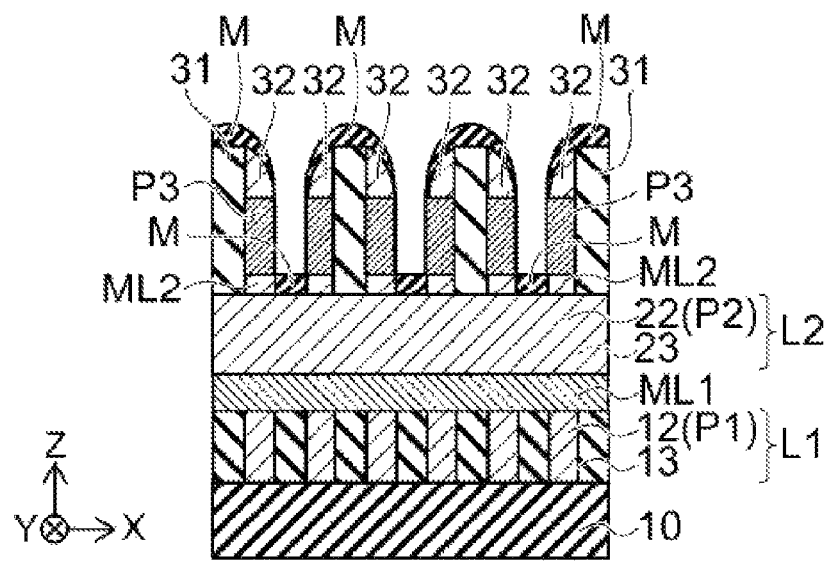

Next, as shown in FIG. 5B, the third coating 32 of amorphous silicon is silicided. For example, the third coating 32 of amorphous silicon is subjected to a rapid heat treatment in nitrogen atmosphere at 450° C. for 30 seconds. This consequently promotes the siliciding reaction between the second metal film 34 of Ni and the third coating 32 of amorphous silicon abutted to the second metal film 34, for example. An unreacted second metal film (e.g., Ni) 34 is selectively removed by being immersed in a mixed liquid of sulfuric acid and aqueous hydrogen peroxide.

As a result, a part of the third coating 32 is silicided at the center part of the side face of the third coating 32 which was in contact with the second metal film 34, thereby allowing a part of the third coating 32 to form multiple interconnect patterns (the third interconnect P3). Specifically, during this siliciding process, because the second metal film 34 is formed in contact with only the center part of the side face of the third coating 32, a lower end of the third coating 32 (i.e., the second interconnect P2-side end) and an upper end of the third coating 32 are not silicided and only a portion of the third coating 32 between the lower end and the upper end is silicided. The third interconnect P3 formed by this siliciding process generally has a line width slightly larger than the thickness of the third coating 32. For example, when the third coating 32 has a film thickness of 8 nm, the third interconnect P3 has a line width of about 10 nm.

On the other hand, the not-silicided lower end of the third coating 32 becomes the second interlayer film ML2 of amorphous silicon.

Figure 5C:
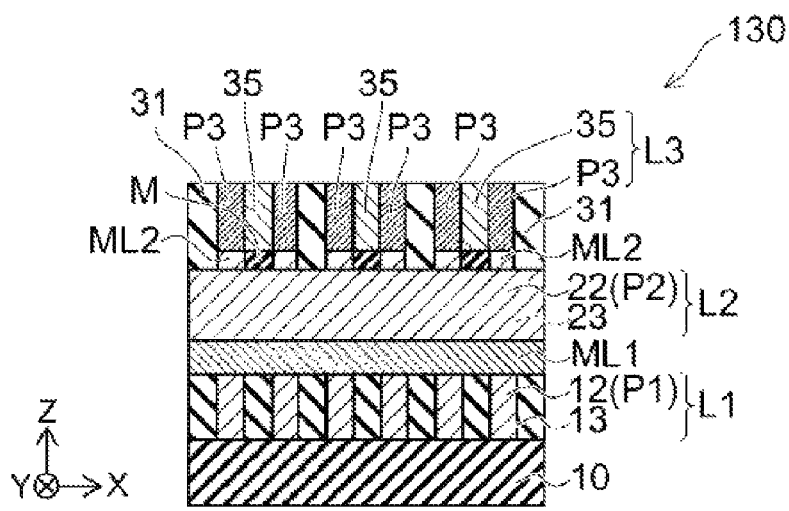

After the formation of the third interconnect P3, as shown in FIG. 5C, the third insulating film 35 is formed between the plurality of third interconnects P3.

The third insulating film 35 is composed, for example, of silicon oxide. The third insulating film 35 can be formed by applying a fluid material, such as SOG (Spin on Glass: silicone compound RnSi (OH) 4-n and dopant material) and subsequent hardening. The third insulating film 35 is deposited by spin coating, for example. The surface of the third insulating film 35 is then planarized by the CMP method, for example. The third layer L3 formed in this manner includes the third interconnect P3 and the third insulating film 35.

It should be noted that the formation of the third layer L3 also creates, in a self-aligned manner, the second interlayer film ML2 only at the lower side of the third interconnect P3, so that this lower end which is not silicided serves as an insulating interlayer interposed between two electrodes (i.e., P2 and P3). Unlike the formation process of IM1 and L2, this consequently obviates the need to remove the third support element 31 to expose and remove a part of a second interlayer film, which would otherwise be formed under the third support element 31 and therefore be required to be removed. Through these steps, the semiconductor device 130 is completed.

The semiconductor device 130 is structured so that the third layer L3 is stacked over the second layer L2. The second interlayer film (amorphous silicon) ML2 is provided between the second interconnect P2 of L2 and the third interconnect P3 of L3, and functions as an insulating interlayer interposed between two electrodes of a double-decker resistance change memory. The second interconnect P2 not only serves as an interconnect (i.e., as a part of electrodes of cross-point type memory cell) but also provides a source material for conduction path (filament) formation (i.e., positively-charged Ag ions) into the second interlayer film (i.e., amorphous silicon, ML2), so that Ag-containing filament can be reversibly formed to repeatably change a resistance between P2 and P3.

Another configuration also may be used in which the third layer L3 formed by this process has thereon a layered structure similar to that of the second layer L2 and the third layer L3 that is repeatedly formed by the processes as shown in FIG. 3A to FIG. 5C. As a result, a cross-point type semiconductor storage device having a multi-layer structure is formed.

According to the manufacturing method of the semiconductor device 130 of this embodiment, only the center part of the third coating 32 can be silicided to form the third interconnect P3, while leaving the amorphous silicon intact at the lower foot of the third interconnect P3. The second interlayer film ML2 is formed to be in contact with the second and third interconnects, P2 and P3, in a self-aligned manner. Thus, a double-decker resistance change memory in which the third interconnect P3 having a line width of 10 nm or less, for example, and the second interlayer film ML2 exactly arranged in a self-aligned manner under P3, can be easily and stably formed.

Generally, it is very difficult to reduce a line width of copper (Cu) interconnect below 10 nm or less. This is because a reduced interconnect width causes a precipitous increase of wire resistance due to the electron scattering at the interconnect surface and interface. In addition, copper is highly reactive with amorphous silicon and, thus, cannot be used as a stable electrode material.

The same difficulty also applies to tungsten (W) as the interconnect metal. Moreover, it is difficult to physically form tungsten wires having widths of 10 nm or less in a uniform and stable manner. High-yield formation of high density and ultra fine W structures cannot be achieved easily. The formation of a uniform tungsten film requires the use of the CVD method. However, the resultant tungsten poorly adheres to the underlying layers. Thus, it is very difficult to stably form a low-resistance interconnect. Furthermore, it is difficult to etch off tungsten by the RIE method.

In this embodiment, however, a support element (the first support element 11 and the third support element 31) is used to form amorphous silicon on the side face of this support element. Then, the resultant structure is processed by a well-established Si RIE method and silicidation. A troublesome metal RIE process is dispensed with. Thus, an interconnect having a line width of 10 nm or less can be readily formed. By avoiding the metal RIE process, the risk of metallic contamination and associated defect formation is also well contained.

Furthermore, the interconnect obtained by siliciding amorphous silicon can provide the formation of a low-resistance metal interconnect array even with a line width of 10 nm or less, due to the silicide's strong immunity against resistance increase by miniaturization.

Adherence of the silicided interconnect (the first interconnect P1 and the third interconnect P3) (e.g., nickel silicide) to the support element (e.g., oxide silicon) is also excellent. There is no need to additionally form an nm-width high-resistance adhesion layer (e.g., a titanium nitride layer). It is otherwise indispensable for a poor-adhesive tungsten interconnect by the CVD method. In a tightly packed configuration (e.g., less than 10 nm wide line and space array), the presence of such a nanometer-width high-resistance adhesion layer reduces an effective interconnect width available. This is because the total thickness of the high-resistance adhesion layer and the tungsten layer must be kept below a certain value (e.g., 10 nm). The reduction of the interconnect width causes a higher resistance. According to this embodiment, an interconnect not requiring an adhesion layer can be used to provide a low-resistance metal interconnect for a cross-point type memory cell.

The semiconductor device 130 is configured so that the first layer L1 has multiple first interconnects P1, the second layer L2 has multiple second interconnects P2 and the third layer L3 has multiple third interconnects P3. Therefore, memory cells are provided between the multiple first interconnects P1 and the multiple second interconnects P2 and between the multiple second interconnects P2 and the multiple third interconnects P3, respectively. This consequently results in a high memory-capacity semiconductor storage device in which a plurality of memory cells is stacked over a plurality of memory cells.

A more-than-double-decked semiconductor storage device also may be similarly obtained by repeatedly forming, on the third layer L3, a layer structure similar to those of the second layer L2 and the third layer L3.

(Embodiment 4)

Next, the following section will describe a semiconductor device according to Embodiment 4. The semiconductor device according to Embodiment 4 includes at least the first interconnect P1 formed by Embodiment 1 and the third interconnect P3 formed by Embodiment 3. The first interconnect P1 and the third interconnect P3 used in the semiconductor device according to Embodiment 4 is a interconnect obtained by siliciding Ni (nickel silicide interconnect). At least a part of the multiple first interconnects P1 has a Ni atomic composition ratio of 50% or more. At least a part of the multiple third interconnects P3 has a Ni atomic composition ratio of 50% or more.

The inventor of this application has used the manufacturing method according to this embodiment to form nickel silicide interconnects corresponding to the first interconnect P1 and the third interconnect P3 and has investigated the properties in detail. It is found that the nickel silicide interconnect formed by the manufacturing method according to the present invention had remarkably different characteristics from those of more conventional interconnects.

FIG. 6 to FIG. 9 illustrate the relationship between the resistivity and the temperature coefficient of resistance of variously formed nickel silicide interconnects.

Figure 6:
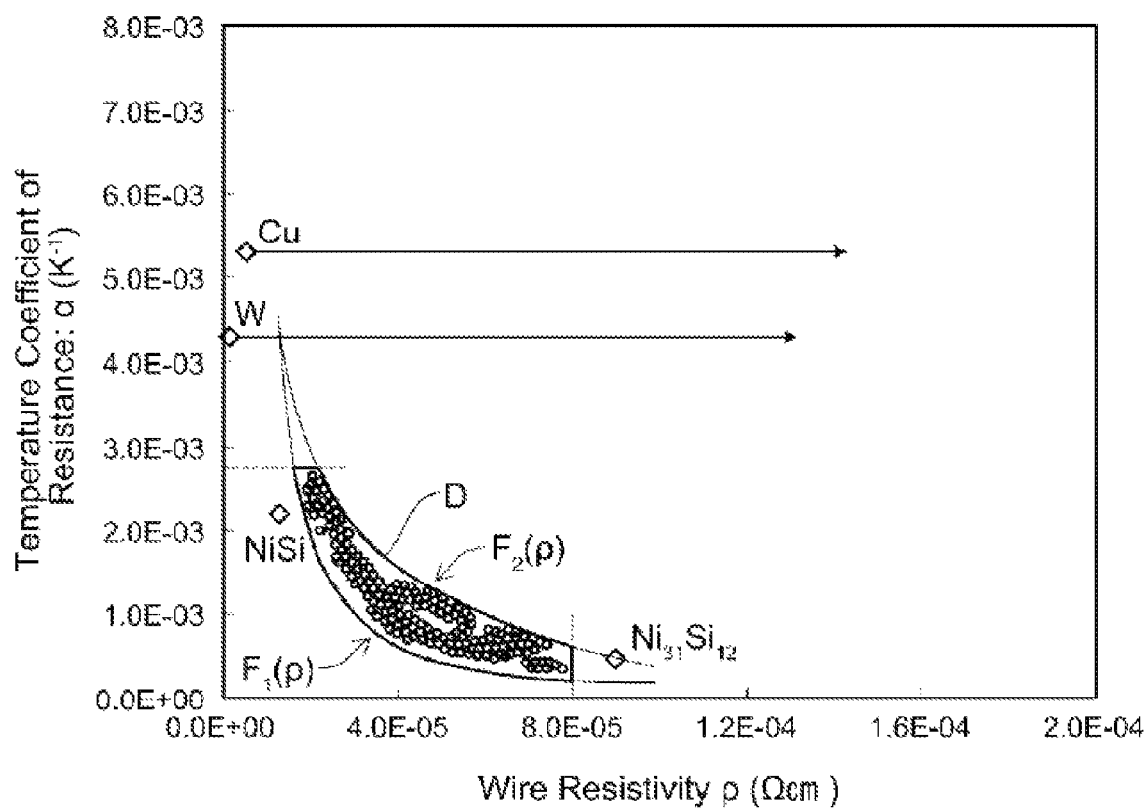
FIGS. 6 to 9 illustrate the relationship between resistivity and temperature coefficient of resistance for different material compositions.

FIG. 6 shows the temperature coefficient $\alpha$ plotted as a function of the resistivity $\rho$ of various nickel silicide interconnects thus formed.

The nickel silicide interconnect shown in FIG. 6 is formed in the manner as described below. Specifically, first, as shown in FIG. 4C, the side face 31a of an insulator support element (the third support element 31) has amorphous silicon (the third coating 32) formed thereon having a thickness of about 8 nm. Then, a side face of the amorphous silicon has Ni (the second metal film 34) that is sputter-deposited to have a thickness of from 3 nm to 7 nm. Thereafter, the resultant structure is annealed by a rapid heat treatment in a nitrogen atmosphere at a temperature of from 350° C. to 600° C., for a period of between 30 seconds and 60 seconds, causing silicidation. FIG. 6 shows the correlation between the resistivity $\rho$ and the temperature coefficient $\alpha$ of 4,000 or more nickel silicide interconnects thus formed under various conditions.

The temperature coefficient $\alpha$ is defined by the following formula based on a temperature dependence of the resistivity $\rho$.

$$\rho(T)=\rho(To)\{1+\alpha(T-To)\}$$

In this formula, T shows a temperature (either in degree ° C. or kelvin K) of the wire in measurement and To shows a reference temperature of 0° C. (273 kelvin (K)). The resistivity $\rho$ is represented as a function $\rho(T)$ with the temperature T.

Generally, it is known that various conductive materials have their own specific values of temperature coefficients depending on the crystal structure, carrier population, carrier state density, conduction mechanism or the like. In other words, the material can be distinguished based on its own temperature coefficient. FIG. 6 shows, as a reference, the temperature coefficients and bulk resistivities of Cu, W, NiSi, and $Ni_{31}Si_{12}$. The bulk resistivity is a resistivity when the size of the material is much larger than the microscopic length scale such as mean free path of the free carriers. When the material such as Cu or W is formed to have a width of 10 nm or less (i.e., much shorter than its mean free path), it is expected that its resistivity increases significantly, as previously described. In FIG. 6, the arrows shown for Cu and W indicate the expected increase of the resistivity.

As shown in FIG. 6, the nickel silicide interconnect formed by the manufacturing method according to this embodiment shows a peculiar temperature coefficient. Notably, the temperature coefficient changes continuously depending on the silicidation condition and does not have a fixed value. This is in sharp contrast with general characteristics of materials, which have their own specific temperature coefficients.

This is presumably due to the fact that the nickel silicide interconnect formed by the manufacturing method according to this embodiment does not have a conventionally known specific silicide structure. Depending on the silicidation condition, some transient structure or a complex polycrystalline texture must be realized. This can be considered to be a specific effect attained by siliciding very thin amorphous silicon of 10 nm or less.

Furthermore, it is also found that the resistivity ρ (ohm centimeter (Ωcm)) and the temperature coefficient α ($K^{-1}$) of the nickel silicide interconnect correlates in a very distinguishing way. Regardless of the formation conditions, when plotted in the ρ-α plane, the individual points, (ρ, α), scatter only in a narrow specific region D as defined below. The fact that the wire's (ρ, α) falls in this distinct characteristic region D unequivocally signifies that the nickel silicide interconnect is formed by the manufacturing method according to this embodiment.

The region D is defined as shown below.

$$\rho < 8 \times 10^{-5}$$

$$\alpha < 2.7 \times 10^{-3}$$

$$F_1(\rho) < \alpha < F_2(\rho)$$

$F_1(\rho)$ and $F_2(\rho)$ are defined as shown below.
(In the case of $1 \times 10^{-5} < \rho \le 4.5 \times 10^{-5}$)

$$F_1(\rho) = A_1 \times \rho^{P1}$$

$$F_2(\rho) = A_2 \times \rho^{P2}$$

$A_1 = 1.809 \times 10^{-11}$
$P1 = -1.714$
$A_2 = 1.337 \times 10^{-7}$
$P2 = -0.9257$
(In the case of $4.5 \times 10^{-5} < \rho \le 1 \times 10^{-4}$)

$$F_1(\rho) = B_1 \times \rho^2 + C_1 \times \rho + D_1$$

$$F_2(\rho) = B_2 \times \rho^2 + C_2 \times \rho + D_2$$

$B_1 = 1.324 \times 10^5$
$C_1 = -2.476 \times 10^1$
$D_1 = 1.353 \times 10^{-3}$
$B_2 = 1.841 \times 10^5$
$C_2 = -4.487 \times 10^1$
$D_2 = 3.040 \times 10^{-3}$ As a reference, FIG. 6 also shows the two functions $F_1(\rho)$ and $F_2(\rho)$.

As explained above, according to the manufacturing method of this embodiment, the temperature coefficient α ($K^{-1}$) of the nickel silicide interconnect can be freely adjusted within the characteristic region D at will, by simply tuning the nickel silicide formation conditions. This is very significant for a practical application as shown below.

In general, a lower temperature coefficient α ensures stable operation of electronic devices because variation of interconnect resistance during the device operation, which is due to temperature increase caused by heat generation, is effectively suppressed.

On the other hand, a higher temperature coefficient α is preferable because the interconnect resistance can be effectively reduced by cooling the electronic device, thus facilitating high-speed operation.

As evident in FIG. 6, according to the manufacturing method of this embodiment, a temperature coefficient equal to or lower than that of $Ni_{31}Si_{12}$ can be realized by tuning the nickel silicide formation conditions. Among the stable compounds of Ni and Si, $Ni_{31}Si_{12}$ is known to have the lowest temperature coefficient (i.e., a temperature coefficient of $4.8 \times 10^{-4} K^{-1}$ and a resistivity of 90 μΩcm). In the manufacturing method according to the present embodiment, however, by adjusting the formation conditions to form a nickel silicide interconnect, a temperature coefficient lower than this known minimum value (i.e., that of $Ni_{31}Si_{12}$) can be obtained together with a resistivity lower than that of $Ni_{31}Si_{12}$. Such a low temperature coefficient and a low resistivity enable stable and high-speed operation of electronic devices in a degree otherwise unattainable with the conventional nickel silicide material.

Also as evident in FIG. 6, according to the manufacturing method of this embodiment, a temperature coefficient is equal to or higher than that of NiSi can be realized by tuning the nickel silicide formation conditions. Among the stable compounds of Ni and Si, NiSi is known to have the highest temperature coefficient (a temperature coefficient of $2.2 \times 10^{-3} K^{-1}$, resistivity of 15 μΩcm). In the manufacturing method according to the present embodiment, however, by adjusting the formation conditions to form a nickel silicide interconnect, a temperature coefficient higher than this known maximum value (i.e., that of NiSi) can be obtained together with a resistivity similar to that of NiSi. Such a high temperature coefficient and a low resistivity enable high-speed operation at a low temperature in a degree otherwise unattainable with the conventional nickel silicide material.

Figure 7:
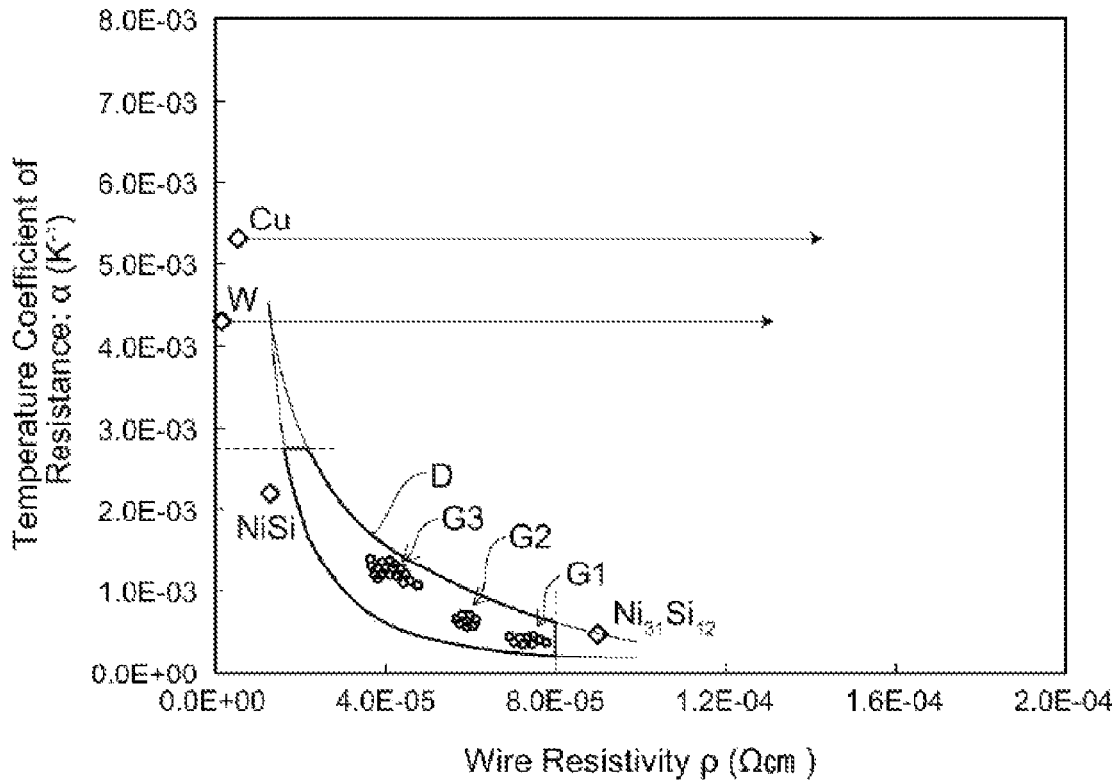

FIG. 7 explains how interconnect's (ρ, α) values can be adjusted by tuning the nickel silicide formation conditions. In FIG. 7, an ensemble of (ρ, α) values are plotted for groups G1 to G3 of the nickel silicide interconnects. Each group is formed distinctly in a different condition. Namely, the thickness of deposited Ni film is increased in the order of G1<G2<G3. The samples are then subjected to a heat treatment at a temperature of 350° C. The scatter within the same group is much smaller than the difference between groups. The fact demonstrates that (ρ, α) values can be readily controlled in a manufacturable way by tuning the nickel silicide formation conditions. Obviously a low resistivity interconnect with a temperature coefficient lower than that of $Ni_{31}Si_{12}$ can be stably obtained by the manufacturing method according to this embodiment (see G1).

Figure 8:
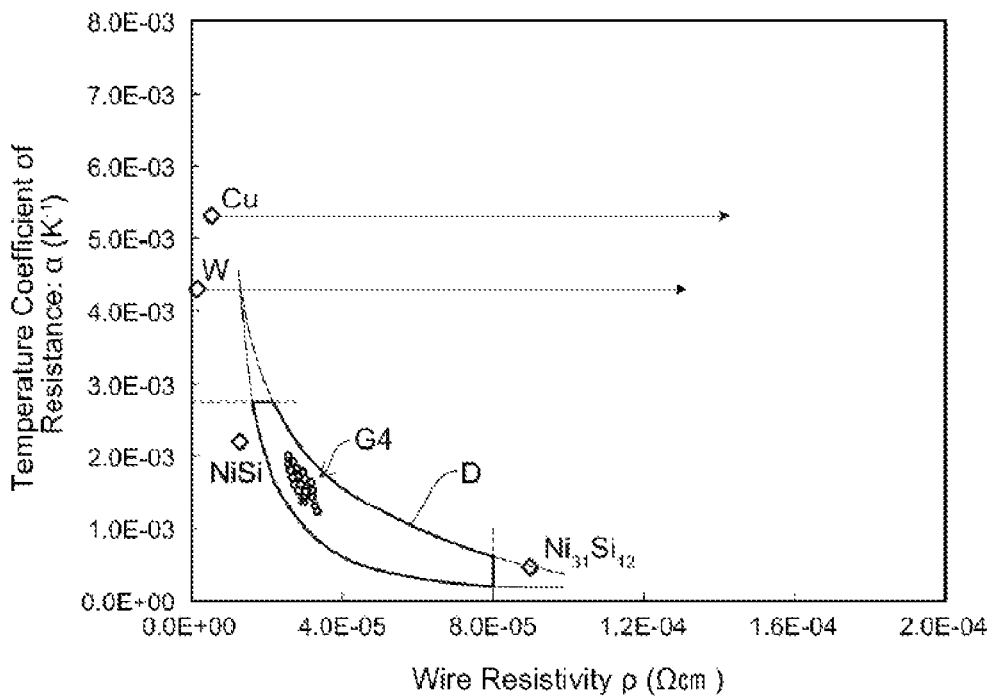

FIG. 8 shows an ensemble of (ρ, α) values plotted for the group G4 of the nickel silicide interconnects. The group G4 is obtained, for example, by depositing Ni to have the same film thickness as that of the group G3 and subsequently subjecting the resultant structure to a heat treatment at a temperature of 600° C.

Figure 9:
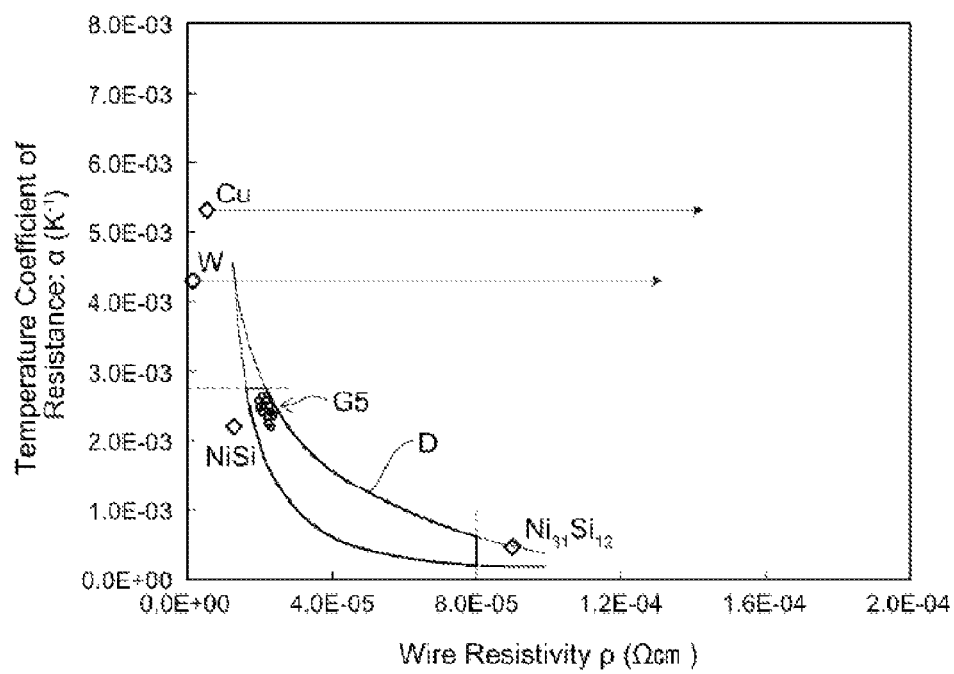

FIG. 9 shows an ensemble of (ρ, α) values plotted for the group G5 of the nickel silicide interconnects. The group G5 is obtained, for example, by depositing Ni to have the same film thickness as that of the group G1 and subsequently subjecting the resultant structure to a heat treatment at a temperature of 600° C. It is obvious that a low resistivity interconnect with a temperature coefficient higher than that of NiSi can be stably obtained by the manufacturing method according to this embodiment.

Interestingly, when the interconnects are subjected to a heat treatment at a temperature of 350° C., the resultant resistivity aligns in the order G1>G2>G3 (i.e., the resistivity increases with the decrease of the deposited Ni thickness, see FIG. 7).

On the other hand, when the interconnects are subjected to a heat treatment at 600° C., the resultant resistivity is higher with an increase of the film thickness of deposited Ni (i.e., the resistivity aligns in the order G5<G4, see FIG. 8,9).

As illustrate above, the dependence of $(\rho, \alpha)$ values on the formation conditions cannot be easily anticipated or inferred even by those skilled in the art. In order to obtain interconnects having desired properties, non-obvious adjustment of the formation conditions is required.

Although the previous example has described a case wherein the temperature coefficient of the nickel silicide interconnect is modulated with different Ni film thickness and heat treatment temperature, this modulation also can be reproduced by maintaining the Ni film thickness and by adjusting the film thickness of the deposited amorphous silicon.

In the case of the nickel silicide interconnect formed by the manufacturing method according to this embodiment, the temperature coefficient is freely adjusted within the region D. This newly obtained latitude allows controllable formation of nickel silicide interconnects having different temperature coefficients and resistivity even in the same electronic device. This is very important because, depending on heat generation and power consumption of respective circuit blocks, the most suitable temperature coefficient and resistivity of the interconnects may differ between circuit blocks even within the same electronic device.

For example, a nickel silicide interconnect having a low temperature coefficient (e.g., group G1) is better formed in or around a circuit block where large heat generation and associated temperature increase are expected. For instance, for the interconnects of memory cells disposed in the proximity of a logic circuit or a driver circuit, which is very frequently accessed, a low temperature coefficient is preferable.

On the other hand, a nickel silicide interconnect having a low resistivity (e.g., group G5) is better formed in or around a circuit block where little heat generation is expected (e.g., a large file-type memory block using block-wise erasing).

By simply adjusting deposition thickness of Si for each circuit block region, depending on the desired resistivity and temperature coefficient, the interconnects properties can be locally changed even within the same semiconductor device, while still retaining all the advantages in the silicide interconnect such as strong immunity against resistance increase by miniaturization. Thus, optimal and stable device operation can be easily secured.

(Embodiment 5)

Next, the following section will describe the semiconductor device according to Embodiment 5. The semiconductor device according to Embodiment 5 includes at least the first interconnect P1 formed by Embodiment 1 and the third interconnect P3 formed by Embodiment 3. The first interconnect P1 and the third interconnect P3 used in the semiconductor device according to Embodiment 5 are an interconnect obtained by siliciding Ni (nickel silicide interconnect). At least a part of the multiple first interconnects P1 has the atomic composition ratio of Ni higher than 1/2 and lower than 2/3. At least a part of the multiple third interconnects P3 has the atomic composition ratio of Ni higher than 1/2 and lower than 2/3.

The inventor of this application has used the manufacturing method according to this embodiment to form the nickel silicide interconnects corresponding to the first interconnect P1 and the third interconnect P3 and has investigated the properties in detail. The result showed that the nickel silicide interconnect formed by the manufacturing method according to this embodiment had a noteworthy characteristic different from that of a conventional interconnect.

Figure 10:
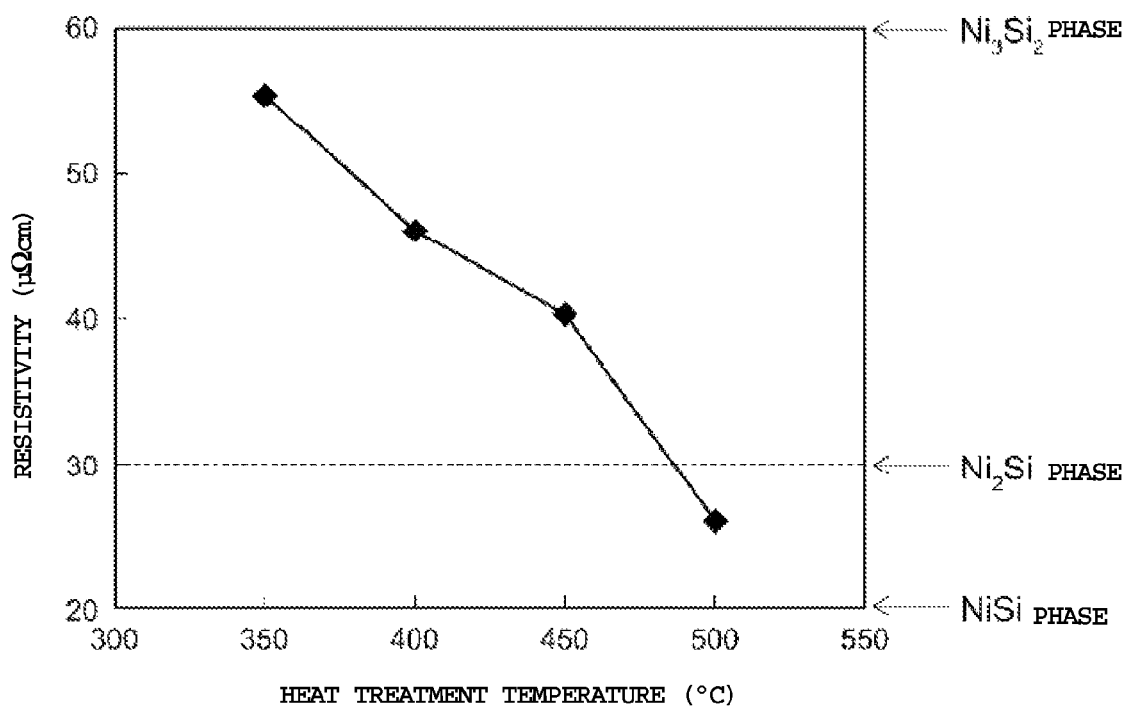
FIG. 10 illustrates the relationship between a heat treatment temperature and the resistivity.

FIG. 10 illustrates the relationship between the heat treatment temperature during the interconnect formation and the resultant resistivity of the interconnects.

FIG. 10 plots the resistivity of the nickel silicide interconnect (in micro ohm centimeter ($\mu\Omega$cm), vertical axis) as a function of the siliciding heat treatment temperature (in ° C., horizontal axis). As a reference, the resistivities of single-phase $Ni_3Si_2$ phase, an $Ni_2Si$ phase, and an NiSi phase are also indicated in the figure.

The nickel silicide interconnects are formed as follows. First, as shown in FIG. 2C of Embodiment 1, only the side face 11a of the support element (the first support element 11) has amorphous silicon (the first coating 12) formed thereon and having a thickness of about 8 nm. In this case, the support element includes silicon oxide. Furthermore, as shown in FIG. 2F, the first metal film 14 is deposited on the surface of the first planarized insulating film 13 by sputtering so that the interconnect has a gross Ni composition ratio of 3/5 (i.e., gross Ni atomic concentration of 60%).

Thereafter, the siliciding process is performed by a heat treatment in a nitrogen atmosphere, thus forming the nickel silicide interconnect (the first interconnect P1). Here, "the gross Ni composition ratio of the interconnect" means a ratio of the number of Ni atoms to the total number of Ni and Si atoms composing "the entire nickel silicide interconnect". When the interconnect has a gross Ni composition ratio of 3/5, it does not necessarily means that Ni atomic concentration is strictly constant along the longitudinal direction of the interconnect. It could vary locally along the interconnect, although its average should converge to 3/5.

A region that can be considered to be "the entire nickel silicide interconnect" does not necessarily extend along the entire length of the first interconnect P1 or the third interconnect P3. So long as the region has, even when constituting only a part of the physical interconnect, a sufficient length much longer than the interconnect width (e.g., the length of about 1,000 nm that is 100 times or larger than the interconnect width), the portion could be practically considered as "the entire nickel silicide interconnect".

More strictly, "a gross Ni composition ratio" is defined as described below. When the local Ni composition ratio is represented as a function of the sampling length of the nickel silicide interconnect, the Ni composition ratio gradually approaches to a fixed value regardless of the sampling point, so long as the sampling length is sufficiently long. "A gross Ni composition ratio" is defined as this limiting value.

The inventor has found that the siliciding of the thin strip-like layer of amorphous silicon, under conditions in which the gross Ni composition ratio is kept constant, shows a different behavior from that of more conventional siliciding of the single crystal silicon substrate.

When the single crystal silicon substrate is silicidized, it can be assumed that an infinite amount of Si is available during the siliciding step. On the other hand, in Embodiment 5, amorphous silicon (the first coating 12) is formed as a thin film and, thus, the amount of available Si is limited for siliciding reaction. Also, all the deposited Ni atoms are consumed during the siliciding reaction. It entails that the gross Ni composition ratio has a finite fixed value throughout the siliciding step of this thin strip-like layer of amorphous silicon.

Under the gross Ni composition ratio of 3/5, a thermodynamically stable phase is a $Ni_3Si_2$ phase. However, as shown in FIG. 10, in this embodiment, a nickel silicide interconnect subjected to a heat treatment at 350° C. shows a resistivity lower than that of the $Ni_2Si_3$ phase even with the gross Ni composition ratio of 3/5.

In this embodiment, the silicided first coating 12 is amorphous, which is thermodynamically unstable. As a result, the phase of the nickel silicide interconnect generated by a heat treatment at 350° C. is assumed to include a thermodynamically unstable phase θ (JCPDS Card No. 73-2093) other than the $Ni_2Si_3$ phase.

Moreover, as shown in FIG. 10, with an increase of the heat treatment temperature, the nickel silicide interconnect tends to show a lower resistivity. If an increase of the annealing temperature prompted formation of a thermodynamically stable phase (i.e., a $Ni_3Si_2$ phase), the resistivity of the nickel silicide interconnect should increase to that of the $Ni_3Si_2$ phase. On the contrary, in this embodiment, an increase of the heat treatment temperature causes a lower resistivity of the nickel silicide interconnect.

As previously described, in this embodiment, the siliciding of a thin film of amorphous silicon is performed under conditions in which the reaction between the amorphous silicon and the total amount of Ni takes place keeping the gross Ni composition ratio constant. Thus, the reduction of the resistivity cannot be attributed to a simple stoichio-changing phase transition. A heat treatment at a temperature of 350° C. or more must have decomposed the θ phase into a plurality of phases different from the $Ni_3Si_2$ phase, while keeping the gross Ni composition ratio to that of $Ni_3Si_2$ phase.

In fact, by performing a heat treatment of about 480° C. or more and preferably about 500° C., the nickel silicide interconnect comes to have an intermediate resistivity between the resistivities of the $Ni_2Si$ phase and the NiSi phase. It is considered that the θ phase is decomposed to a composite which includes at least the NiSi phase and the $Ni_2Si$ phase. In other words, the nickel silicide interconnect thus formed is composed of a plurality of crystal structure commingling in a thin wire structure.

The co-existence of the two phases in the thin wire structure having a thickness of about 8 nm indicates the nickel silicide interconnect to have a part in which the NiSi phase and the $Ni_2Si$ phase are in direct contact with each other.

Figure 11:
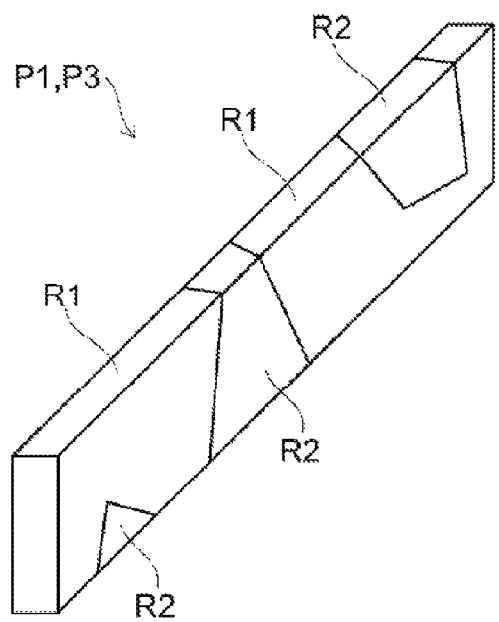
FIG. 11 is a schematic perspective view illustrating the crystal structure in the nickel silicide interconnect according to another embodiment.

FIG. 11 is a schematic perspective view showing the composite crystal structure in the nickel silicide interconnect according to Embodiment 5.

As shown in FIG. 11, the nickel silicide interconnect (e.g., the first interconnect P1 and the third interconnect P3) has patches of NiSi phase region R1 and patches of $Ni_2Si$ phase region R2, commingling in a thin wire structure. The ratio of the amount of NiSi phase region R1 and the amount of $Ni_2Si$ phase region R2 are determined so that the gross Ni composition ratio is kept to 3/5, for example. The NiSi phase region R1 and the $Ni_2Si$ phase region R2 have parts at which the former and the latter are formed in contact with each other.

From a thermodynamic viewpoint, the nickel silicide has a stable crystal phase depending on the Ni composition ratio. For example, the NiSi phase has an Ni composition ratio of 1/2. The $Ni_3Si_2$ phase has a composition ratio of 3/5, and the $Ni_2Si$ phase has an Ni composition ratio of 2/3. When the gross Ni composition ratio is higher than 1/2 and lower than 3/5, nickel silicide must be composed of the NiSi phase and the $Ni_3Si_2$ phase. When the gross Ni composition ratio is 3/5, nickel silicide must be composed purely of the $Ni_3Si_2$ phase. When the gross Ni composition ratio is higher than 3/5 and lower than 2/3, nickel silicide must be composed of the $Ni_3Si_2$ phase and the $Ni_2Si$ phase. Thus, thermodynamically, there is no way that the NiSi phase and the $Ni_2Si$ phase commingle to form a composite nickel silicide when its gross Ni composition ratio is higher than 1/2 and lower than 2/3.

However, in this embodiment, a low-resistance composite of NiSi phase and $Ni_2Si$ phase is formed even when the gross Ni composition ratio is higher than 1/2 and lower than 2/3. This is a very specific structure only realized by the manufacturing method according to this embodiment.

Specifically, because initial formation of the θ phase and its subsequent decomposition into a composite structure are utilized in this embodiment, the peculiar composite of NiSi phase and $Ni_2Si$ phase (both are low resistance phases) is realized without forming a thermodynamically stable but high-resistance crystal phase (e.g., a $Ni_3Si_2$ phase). As described below, this greatly facilitates the stable formation of a low-resistance nickel silicide interconnect.

In actual manufacturing of a large number of identical nickel silicide interconnects, there is a possibility that the gross Ni composition ratio fluctuates among the individual nickel silicide interconnects due to a limited process control. Naturally, the composition ratio fluctuation results in the resistance variation of the nickel silicide interconnects.

In this embodiment, the formation of a low-resistance composite of $Ni_2Si$ phase and NiSi phase prevails over the formation of the high-resistance $Ni_3Si_2$ phase. Thus, even when the gross Ni composition ratio fluctuate among the nickel silicide interconnects, the resistance variation of the nickel silicide interconnects is alleviated because detrimental formation of the high-resistance $Ni_3Si_2$ phase is prevented, allowing stable manufacturing of a large number of identical nickel silicide interconnects.

It should be also noted that, after a high temperature annealing, the composite structure as shown in FIG. 11 appears for both cases wherein the material of the support element (i.e., the first insulating film 13) includes silicon oxide and wherein the material of the support element (i.e., the first insulating film 13) includes silicon nitride.

(Embodiment 6)

Next, the following section will describe a semiconductor device according to Embodiment 6. The semiconductor device according to Embodiment 6 includes at least the first interconnect P1 formed by Embodiment 1 and the third interconnect P3 formed by Embodiment 3. The first interconnect P1 and the third interconnect P3 used in the semiconductor device according to Embodiment 5 are an interconnect obtained by siliciding Ni (nickel silicide interconnect). At least a part of the multiple first interconnects P1 has gross Ni composition ratio of 50% or more. At least a part of the multiple first interconnects P3 has the gross Ni composition ratio of 50% or more. The term "gross Ni composition ratio" in Embodiment 6 has the same meaning as "gross Ni composition ratio" used in Embodiment 5.

The present inventor has found that the nickel silicide interconnect has a different resistivity depending on the material of the support element formed in contact with the nickel silicide interconnect.

Figure 12:
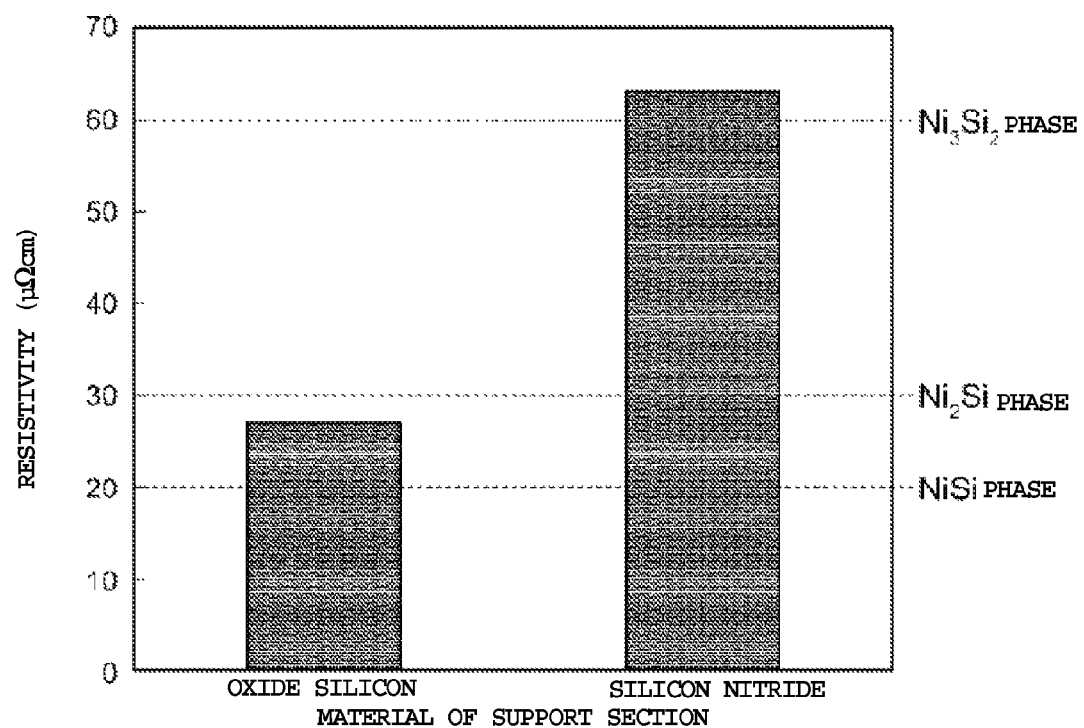
FIG. 12 illustrates the relationship between the material used for the support element and the resistivity.

FIG. 12 compares the resistivities of the nickel silicide interconnect formed on the support element of silicon oxide (left) and the support element of silicon nitride (right). The nickel silicide interconnects are formed as in Embodiment 5. For both cases, the formation process is identical except for the material of the support element (i.e., the heat treatment temperature is about 500° C. and the width of the resultant nickel silicide interconnect is about 8 nm).

When the support element includes silicon oxide, as already described in Embodiment 5, the nickel silicide interconnect has an intermediate resistivity between the resistivities of the $Ni_2Si$ phase and the NiSi phase. In this case, the nickel silicide interconnect is considered to have a low-resistance NiSi phase and Ni$_2$Si phase.

On the other hand, when the support element includes silicon nitride, the resistivity of the nickel silicide interconnect does not decrease even with the annealing temperature of 500° C. The phase transformation is retarded and the nickel silicide interconnect remains to have a resistivity close to that of the Ni$_3$Si$_2$ phase. In this case, the nickel silicide interconnect is assumed to have the θ phase or the Ni$_3$Si$_2$ phase.

It is clearly shown, for the formation of narrow interconnects by siliciding thin amorphous silicon coating according to the present invention, the resultant resistivity of the nickel silicide interconnect can be controlled by changing the material of the underlying support element abutted to the amorphous silicon, even when an identical silicidation process is applied.

This discovery is utilized, in this embodiment, to control the phase transformation of the nickel silicide interconnect, by changing the material of the support element, thereby providing optimum interconnects characteristics for respective circuit blocks in the same electronic device, even when an identical silicidation process is applied.

For example, a nickel silicide interconnect having a low resistivity is better formed in or around a circuit block where little heat generation is expected (e.g., a large file-type memory block using block-wise erasing). In this case, by forming the support element with silicon oxide, a low-resistance nickel silicide interconnect having the NiSi phase and the Ni$_2$Si phase can be formed.

On the other hand, a nickel silicide interconnect having a low temperature coefficient is better formed in or around a circuit block where large heat generation and associated temperature increase are expected. For instance, for the interconnects of memory cells disposed in the proximity of a logic circuit or a driver circuit, which is very frequently accessed, a low temperature coefficient is preferable. In this case, the support element can be formed by silicon nitride to thereby form a high-resistance but a low temperature coefficient nickel silicide interconnect (see characteristic region D in FIG. 6), having the θ phase or the Ni$_3$Si$_2$ phase.

By changing the material of the underlying support element, the interconnects properties can be locally changed to have desired resistivities and temperature coefficients in the same electronic device.

This finding also can be used to form a semiconductor device having the configuration as shown below, for example.

The semiconductor device includes multiple first interconnects P1 and multiple first insulating films 13. The plurality of first insulating films 13 has: the first region that is formed in contact with any of the multiple first wirings P1 and that includes oxide silicon; and the second region that is formed in contact with any of the plurality of first wirings P1 not in contact with the first region and that includes silicon nitride. The first wiring P1 contacting the first region has the NiSi phase and the Ni$_2$Si phase. The first wiring P1 abutted to the second region has the θ phase or the Ni$_3$Si$_2$ phase.

In this case, the first wiring P1 is formed by performing a heat treatment at 480° C. or more, for example. Then, the region abutted to the first region includes the low-resistance NiSi phase and the Ni$_2$Si phase. On the other hand, the region abutted to the second region includes the high-resistance θ phase or the Ni$_3$Si$_2$ phase. As previously described, one heat treatment step can be used to form the first wirings P1 having different resistivities in different regions. Thus, depending on the position of the semiconductor device, the temperature coefficient of the nickel silicide wiring can be locally changed.

Although Embodiment 6 has described a case where the first wiring P1 is formed, the third wiring P3 also can be formed to form a nickel silicide wiring having a different crystal structure depending on the material of the support element.

As previously described, according to the semiconductor device manufacturing method and the semiconductor device of the embodiment, an interconnect pattern can be formed in a uniform and stable manner.

Although various embodiments have been described, the present invention is not limited to these embodiments. For example, those skilled in the art can appropriately add or delete the components, can change the design in the respective embodiments, or can appropriately combine the respective embodiments within the scope of the present invention.

While certain embodiments have been described, these embodiments have been presented by way of example only, and they are not intended to limit the scope of the invention. Indeed, the novel embodiment described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the invention.

What is claimed is:

1. A semiconductor device manufacturing method, comprising:
    forming, on an insulating base material, a plurality of first support elements, each having a top surface and side surfaces that extend from a top surface of the insulating base material;
    forming a coating of amorphous silicon on the side surfaces;
    removing the plurality of first support elements, wherein a plurality of apertures is defined by a remainder of the coating of amorphous silicon;
    filling the plurality of apertures with an insulating film;
    planarizing the insulating film until an upper portion of the coating is exposed between adjacent surface regions of the insulating film; and
    siliciding the coating to form an interconnect.

2. The semiconductor device manufacturing method according to claim 1, wherein the siliciding of the coating comprises forming a metal film on the exposed portion of the coating and the planarized surface of the insulating film filled in the apertures.

3. The semiconductor device manufacturing method according to claim 2, wherein the metal film comprises at least one of nickel, cobalt, and titanium.

4. The semiconductor device manufacturing method according to claim 2, wherein the metal film contains nickel, and the siliciding of the coating comprises performing a heat treatment on the coating and the metal film to form the interconnect, the interconnect including a compound that comprises NiSi phase and Ni$_2$Si phase.

5. The semiconductor device manufacturing method according to claim 2, wherein the metal film contains nickel, and the siliciding of the coating comprises:
    performing a heat treatment to form a θ phase of nickel silicide; and
    decomposing the θ phase of the nickel silicide into a compound comprising NiSi phase and Ni$_2$Si phase.

6. The semiconductor device manufacturing method according to claim 1, further comprising:
   forming an interlayer film on the insulating film and the interconnect;
   forming, on the interlayer film, a plurality of second support elements, each having side surfaces that extend from a top surface of the interlayer film;
   forming a coating of metal on the side surfaces of the second support elements; and
   removing the second support elements to form an interconnect with the remaining coating of metal.

7. A semiconductor device manufacturing method, comprising:
   forming, on a base material, a plurality of support elements, each having a top surface and side surfaces that extend from a top surface of the base material;
   forming a coating on the side surfaces;
   forming a metal film containing nickel on side surfaces of the coating that extend from the top surface of the base material; and
   performing a heat treatment to silicide the coating such that an interconnect is formed, wherein the interconnect includes a compound comprising NiSi phase and $Ni_2Si$ phase.

8. The semiconductor device manufacturing method according to claim 7, wherein the forming of the interconnect includes:
   performing the heat treatment to form a θ phase of nickel silicide; and
   decomposing the θ phase of the nickel silicide into a compound comprising NiSi phase and $Ni_2Si$ phase.

9. The semiconductor device manufacturing method according to claim 7, further comprising: prior to forming the metal film on the side surfaces of the coating, forming a mask on portions of the coating.

10. The semiconductor device manufacturing method according to claim 9, wherein the mask is formed using a gas cluster ion beam.

* * * * *